United States Patent [19]

Asaka

[11] Patent Number: 5,721,690
[45] Date of Patent: Feb. 24, 1998

[54] LOGIC CIRCUIT SYNTHESIS

[75] Inventor: Toshiharu Asaka, Tokyo, Japan

[73] Assignee: NEC Corporation, Tokyo, Japan

[21] Appl. No.: 516,549

[22] Filed: Aug. 18, 1995

[30] Foreign Application Priority Data

Aug. 18, 1994 [JP] Japan ................. 6-215215

[51] Int. Cl.$^6$ ................................. G06F 17/50
[52] U.S. Cl. ............................ 364/489; 364/488
[58] Field of Search ........................ 364/488, 489, 364/490

[56] References Cited

U.S. PATENT DOCUMENTS

| | | | |
|---|---|---|---|
| 5,029,102 | 7/1991 | Drumm et al. | 364/489 |
| 5,287,289 | 2/1994 | Kageyama et al. | 364/489 |
| 5,436,849 | 7/1995 | Drumm | 364/490 |
| 5,452,227 | 9/1995 | Kelsey et al. | 364/489 |
| 5,461,574 | 10/1995 | Matsunaga et al. | 364/489 |
| 5,473,546 | 12/1995 | Filseth | 364/489 |
| 5,493,504 | 2/1996 | Minato | 364/488 |
| 5,500,808 | 3/1996 | Wang | 364/578 |
| 5,517,132 | 5/1996 | Ohara | 364/491 |
| 5,537,330 | 7/1996 | Damiano et al. | 364/489 |
| 5,572,436 | 11/1996 | Dangelo et al. | 364/489 |

FOREIGN PATENT DOCUMENTS 4-352283  12/1992  Japan.

OTHER PUBLICATIONS

"MIS: A Multiple-Level Logic Optimization System" by R. K. Brayton et al, IEEE Transactions On Computer-Aided Design, vol. CAD-6, No. 6, Nov. 1987, pp. 1062-1081.

*Primary Examiner*—Vincent N. Trans
*Attorney, Agent, or Firm*—Young & Thompson

[57] ABSTRACT

A method for a logic optimization in a logic synthesis comprises the following steps. Prior to an actual execution of a logic flattening process, a scale of unoptimized circuits is estimated assuming that the unoptimized circuits have already been subjected to the logical flattening. The unoptimized circuits are subjected to a two-level logic optimization only when an estimated scale of the unoptimized circuits exceeds a predetermined threshold value. Prior to an actual execution of a logic flattening process, a scale of the optimized circuits is estimated assuming that the optimized circuits have already been subjected to the logic flattening. The optimized circuits are subjected to the logic flattening if an estimated scale of the optimized circuits does not exceed the predetermined threshold value.

6 Claims, 8 Drawing Sheets

FIG. 8

$x = i1*i2 + \overline{i1}*i2$
$x = i1*\overline{i2} + \overline{i2}$ }— 801

$f = x*i3*i4 + x*i3*\overline{i4} + \overline{x}*\overline{i4}*i5* \overline{x}*\overline{i4}*\overline{i5} + i5$ —— 802

$x = i2$
$\overline{x} = \overline{i2}$ }— 803

$f = x*i3 + \overline{x}*\overline{i4} + i5$ —— 804

$f = i2*i3 + \overline{i2}*\overline{i4} + i5$ —— 805

_(1)_

LOGIC CIRCUIT SYNTHESIS

BACKGROUND OF THE INVENTION

The present invention relates to a logic circuit synthesis, and more particularly to a logic circuit synthesis using a two-level logic optimization during a logic flattening process for logic optimization for combinational circuits so as to reduce the necessary memory size and processing time for efficient optimization of large-scale integrated circuits.

In synthesizing a logic circuit, the optimization of the logic circuits may be carried out by considering areas, time delays and other factors as objective functions.

If logic circuits are optimized by considering the area as an objective function, the technology mapping may often be used, wherein combinational circuits described in logic expressions are flattened to two-level logic circuits for two-level logic optimizations and subsequent conversion into multilevel circuits.

The afore-mentioned two-level logic optimizations will be described. The two-level logic optimization is explained as follows. If the following logic expression (1) is given, it may be represented in Karnaugh map form, which is one of the representations of the two-level logic, If a=1 or b=1, a value off equals 1. Expression (1) is then transferred to the following logic expression (2) to eliminate logical redundancies. The optimization by transferring the logic expression (1) to the expression (2) is so called as a two-level logic optimization.

$$f = a \cdot b + \bar{a} \cdot b + a \cdot \bar{b} \quad (1)$$

$$f = a + b \quad (2)$$

where $\bar{a}$ represents logical "NOT" for a.

Multilevel realization called as a multilevel logic realization will be described as follows. In a logic expression (3), for example, terms a·b·c and a·b·d have a common part of a·b. By introducing an intermediate variable e for a·b, the common sections a·b are replaced with one variable e. The logic expression (3) is transferred to multilevel expression (4), meaning that the corresponding circuit is converted to multilevel circuits.

$$f = a \cdot b \cdot c + a \cdot b \cdot d \quad (3)$$

$$e = a \cdot b$$

$$f = e \cdot c + e \cdot d \quad (4)$$

The technology mapping is one of the functions of the logic synthesis tools wherein it is an operation of translating the gate level logic to the design data such as net list and interconnection informations that depend upon a specific semiconductor technology. Using technology mapping, for example, design data for gate arrays or cell base LSIs for another semiconductor manufacture can be obtained from a RTL, or register transfer level description.

When a circuit is described in a hardware description language such as VHDL (VHSIC hardware description language), the circuit may efficiently be optimized by utilizing a logic structure that was described by the designer. In this case, it is not preferable to flatten all of the combinational circuits. Therefore, in another method, some combinational circuits in the circuitry are flattened and subjected to the two-level logic optimization. Then, the multilevel realization is applicable to the combinational circuits, prior to technology mapping.

If a logic circuit is optimized assuming the delay as the objective function, the maximum value of the delay may generally be reduced by a reduction of the logic levels thereof. The method is well-known as follows. By flattening combinational circuits on the critical path of the circuit, the logic levels of the circuit are reduced, resulting in a decrease in the delay of the circuits.

If all of the combinational circuits are flattened, the delay is generally decreased while the area for the circuit is increased. Therefore, in order to reduce the delay together with avoiding any increase of the area of the circuits, logic levels of some parts of the circuits are flattened. Then, flattened circuits are subjected to the multilevel realization as necessary, prior to the technology mapping processes.

Referring to the accompanied drawings, the conventional flattening processes will be described. As illustrated in FIG. 1, a combinational circuit 101, wherein the logic function is x, enters a combinational circuit 102, wherein the logic function is f. With respect to the logic functions f and x, the following expression (5) may be given on the basis of Shannon's expansion theorem:

$$f = x f_x + \bar{x} \overline{f_x} \quad (5)$$

where $\bar{x}$ is a logical NOT (reverse) for x and $f_x$ represents a logic function when an input for the logic function f equals 1, which is so called as a cofactor of the logic function f for x. Also, $\overline{f_x}$ represents a logic function when an input for the logic function f equals "0".

(1) In step 202, flattening is performed with respect to equation (5), as illustrated in FIG. 2. When flattening two-logic function like fund x, which have connective relationship as illustrated in FIG. 5, for the first step, take a logical NOT $\bar{x}$ for x.

(2) In step 203, define f1 as a logical multiplication for the cofactor $f_x$ of the logic function f for x and x.

(3) In step 204, define f0 as a logical multiplication for the cofactor $\overline{f_x}$ for the logic function f for $\bar{x}$ and $\bar{x}$.

(3) In step 205, obtain a logical addition for f1 and f0. It means that x is flattened with respect to f.

(4) To flatten all inputs fan-ins for the combinational circuit 102, repeat the processes from step 201 to step 205.

In the above described flattening process, a computational complexity for processes of obtaining the logical NOT and logical addition is proportional to the square of n, where the number of product terms in a combinational circuit is defined as n. When the flattening process is applied to a large scale circuit, a large amount of memory and a long processing time are required for computation.

Referring to a FIG. 3, an example of optimization in area may comprise the following steps.

(1) In step 301, flatten combinational circuits in the object circuit.

(2) In step 302, apply two-level logic optimization to the flattened two-level logic circuits by a logic compression.

(3) In step 303, apply multilevel realization to the above optimized circuits by extracting common sections thereof.

(4) In step 304, perform technology mapping to a target.

Such kind of logic synthesis concerning the flattening is disclosed in the Japanese Laid-open Patent No. 4-352283. According to the disclosed method, all intermediate variables existing in logic expressions are not be subjected to an expansion. Prior to the expansion of an intermediate variable in logic expressions, a number of product terms corresponding to the variable in the logic expressions which would be obtained by the expansion is calculated. Only if the number of the product terms does not exceed a predetermined value, the corresponding variable is expanded. Thus, the processes for expanding the intermediate variables are diminished, resulting in a reduction of the processing time. Note that expansion process in this method is equivalent to the flattening process.

Referring to FIG. 4, the above method will be described as follows. A flow chart of FIG. 4 is illustrative of the flattening process (step 301) in FIG. 3.

(1) In step 401, extract a subject circuit to be flattened.

(2) In step 402, decide whether there resides an intermediate variable, or a combinational circuit to be flattened.

(3) In step 403, calculate a number of product terms obtained by the flattening.

(4) If the calculated number of the product terms exceeds a predetermined threshold value also referred as an allowable maximum value, reenter step 401 omitting the flattening process. If it does not exceed, flatten the corresponding combinational circuits in step 405 and then reenter step 401.

(5) If no circuit to be flattened remains in step 402, apply the two-level logic optimization to the flattened combinational circuits in step 406 for subsequent multilevel realization in step 407.

In the prior art as mentioned above, if the number of the product terms exceeds the predetermined threshold value, the process for expanding the intermediate variable, namely, the flattening process is not applied to the corresponding circuits. When the number of the product terms is great, the circuits are not applied by enough number of the flattening processes. The reduction in the scale of the circuits may not be accomplished by flattening, meaning that an area of the circuits may not be optimized. The conventional flattening processes require a large amount of memory to be used and processing time to be consumed for optimization of large-scale integrated circuits.

SUMMARY OF THE INVENTION

It is therefore an object of the present invention to provide a novel method and an apparatus for logic synthesis, which is free from any problems described above.

The above and other objects, features and advantages of the present invention will be apparent from the following descriptions.

The present invention provides a method for a logic optimization in a logic synthesis comprising the following steps. Prior to an actual execution of a logic flattening process, a scale of unoptimized circuits is estimated assuming that the unoptimized circuits have already been subjected to the logical flattening. The unoptimized circuits are subjected to a two-level angle optimization only when an estimated scale of the unoptimized circuits exceeds a predetermined threshold value. Prior to an actual execution of a logic flattening process, a scale of the optimized circuits is estimated assuming that the optimized circuits have already been subjected to the logic flattening. The optimized circuits are subjected to the logic flattening if an estimated scale of the optimized circuits does not exceed the predetermined threshold value.

The present invention also provides a method for a logic optimization in a logic synthesis comprising the following steps. Circuits to be subjected to a logic flattening are extracted. Prior to an actual execution era logic flattening process, a scale of unoptimized circuits is estimated assuming that the unoptimized circuits have already been subjected to the logical flattening. There is evaluated whether an estimated scale of the unoptimized circuits exceeds a predetermined threshold value. The unoptimized circuits are subjected to a two-level logic optimization only when an estimated scale of the unoptimized circuits exceeds the predetermined threshold value. After returning to said second step, a scale of the optimized circuits is estimated assuming that the optimized circuits have already been subjected to the logic flattening. After returning to the first extraction step, the optimized circuits to be subjected to the logic flattening are extracted only when an estimated scale of the optimized circuits exceeds the predetermined threshold value. The optimized circuits are subjected to the logic flattening if the estimated scale of the optimized circuits does not exceed the predetermined threshold value. The two-level logic optimization is executed if there is no circuit to be subjected to the logic flattening for subsequent execution of multilevel realizations.

The present invention also provides an apparatus for a logic synthesis. A library input section is provided to enter information of a technology library block for technology mapping. A circuit input section is provided to enter descriptions of a logic circuit to be subjected to a logic synthesis. A constraint condition input section is provided to enter constraint conditions including at least any one of delay and area for the logic circuits. A logic optimization section is provided to execute a two-level logic optimization during a flattening process. A technology mapping section is provided to assign the technology library block to logic circuits in consideration of the given constraint conditions as objective functions. A circuit output section is provided to output as circuits results of processes in the above fifth step. The logic optimization section may advantageously be so arranged as to execute a process comprising the following steps. Prior to an actual execution of a logic flattening process, a scale of unoptimized circuits is estimated assuming that the unoptimized circuits have already been subjected to the logical flattening. The unoptimized circuits are subjected to a two-level logic optimization only when an estimated scale of the unoptimized circuits exceeds a predetermined threshold value. Prior to an actual execution of a logic flattening process, a scale of the optimized circuits is estimated assuming that the optimized circuits have already been subjected to the logic flattening. The optimized circuits are subjected to the logic flattening if an estimated scale of the optimized circuits does not exceed the predetermined threshold value.

BRIEF DESCRIPTIONS OF THE DRAWINGS

Preferred embodiments of the present invention will hereinafter fully be described in detail with reference to the accompanying drawings.

FIG. 8 is a view illustrative of an application of optimization according to the present invention.

DESCRIPTIONS OF THE INVENTION

With reference to the accompanied drawings, a first embodiment of the present invention will be described.

Figure 5:
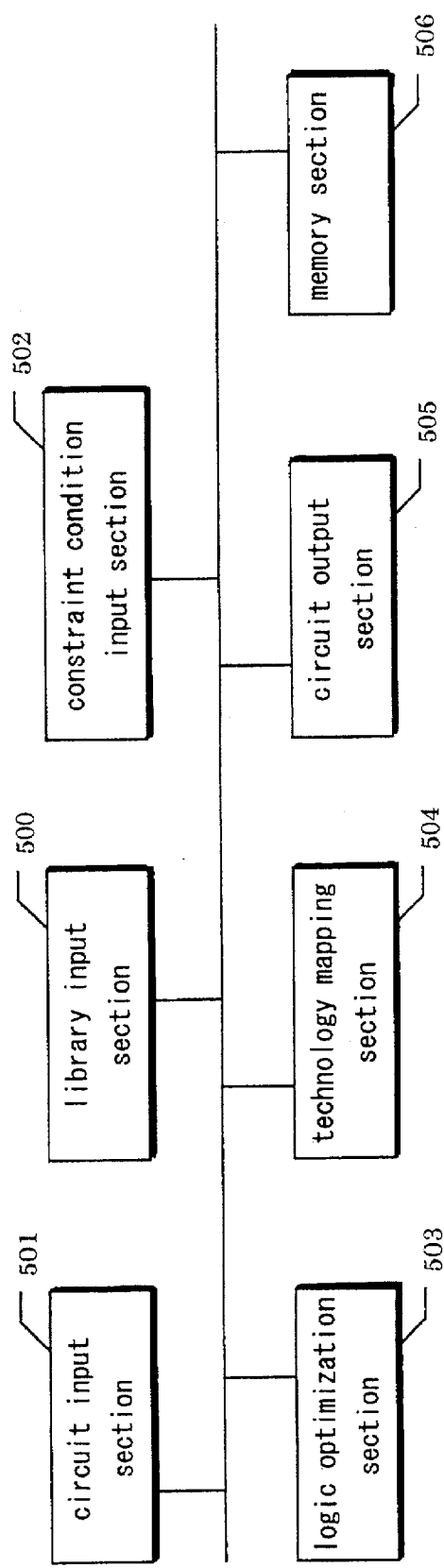
FIG. 5 is a flow chart of a procedure for logic synthesis in an embodiment according to the present invention.

In FIG. 5, there is shown a hardware structure of a logic circuit synthesis device in the embodiment according to the present invention. The device comprises a library input section 500 that enters information about technology library blocks for technology mapping of logic circuits, a circuit input section 501 that enters descriptions as to logic circuits to be subjected to the logic synthesis, a constraint condition input section 502 that enters constraint conditions such as delay and area for logic circuits, a logic optimization section 503 that makes a logical optimization, a technology mapping section 504 that assigns the technology library blocks to the logic circuits by considering given constraint conditions as objective functions, a circuit output section 505 that generates outputs of produced circuits and a memory section 506 that stores the technology libraries, the logic circuits and the constraint conditions.

Figure 6:
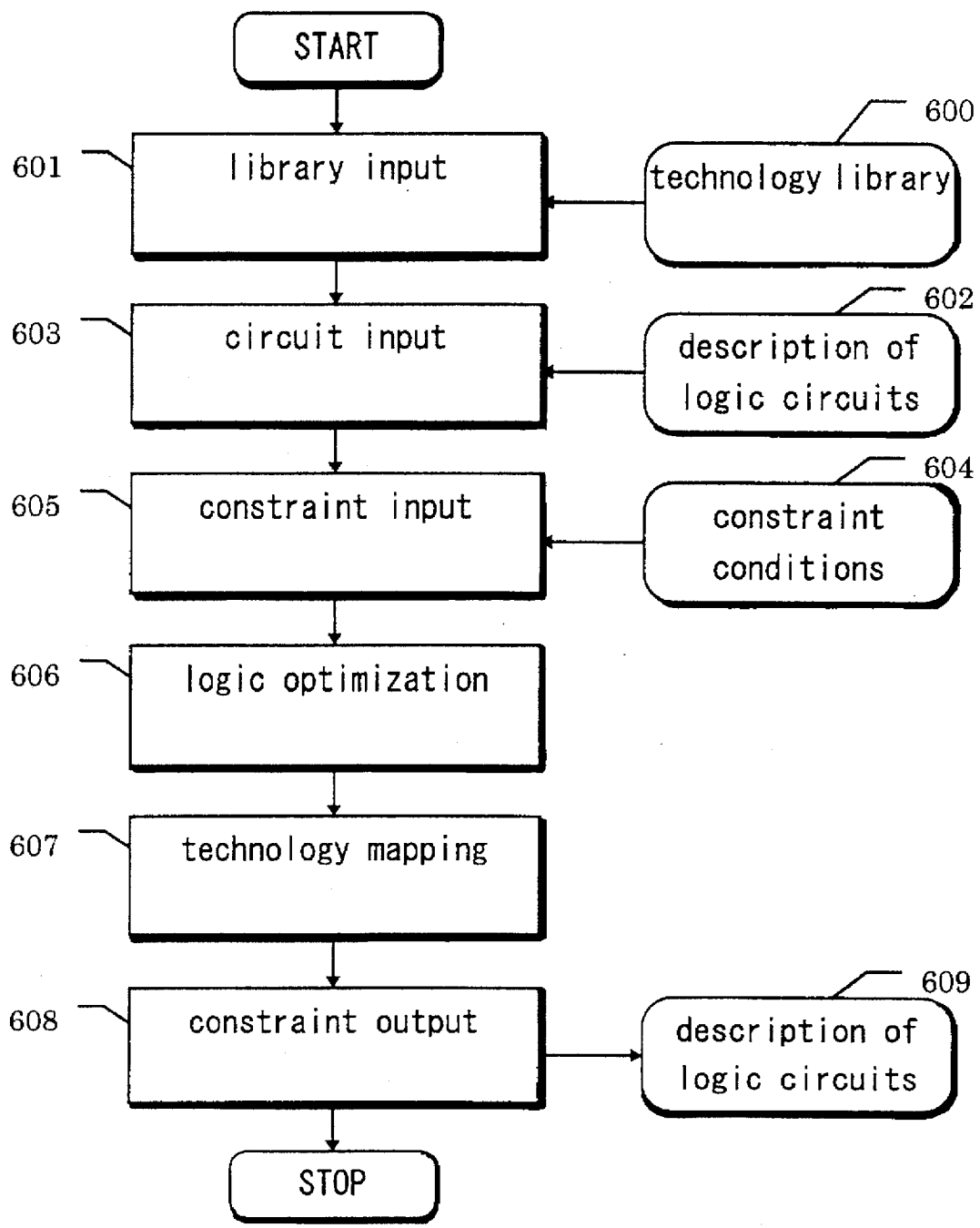
FIG. 6 is a block diagram illustrative of a hardware structure in an embodiment according to the present invention.

FIG. 6 is a flow chart illustrative of the optimization processes in this embodiment.

(1) In step 601, a technology library 600 which comprises information concerning logic, fan-out constraints and other factors of the technology library block is entered by the library input section 500 and then stored in the memory section 506.

(2) In step 603, descriptions of the logic circuits 602 are entered by the circuit input section 501 and then stored in the memory section 506.

(3) In step 605, constraint conditions 604 are entered by the constraint condition section 502 and then stored in the memory section 505.

(4) In step 606, a logic optimization is applied to the logic circuits already stored in the memory section 506 by the logic optimization section 503.

(5) In step 607, the technology library blocks already stored in the memory section 506 are assigned in the technology mapping section 504, wherein the constraint conditions 604 are stored in the memory section 506 as an objective function for the logic circuits having already stored in the memory section 506.

(6) In step 608, an output of the logic circuit stored in the memory section 506, namely descriptions of the logic circuits 609 are generated by the circuit output section 505.

Figure 7:
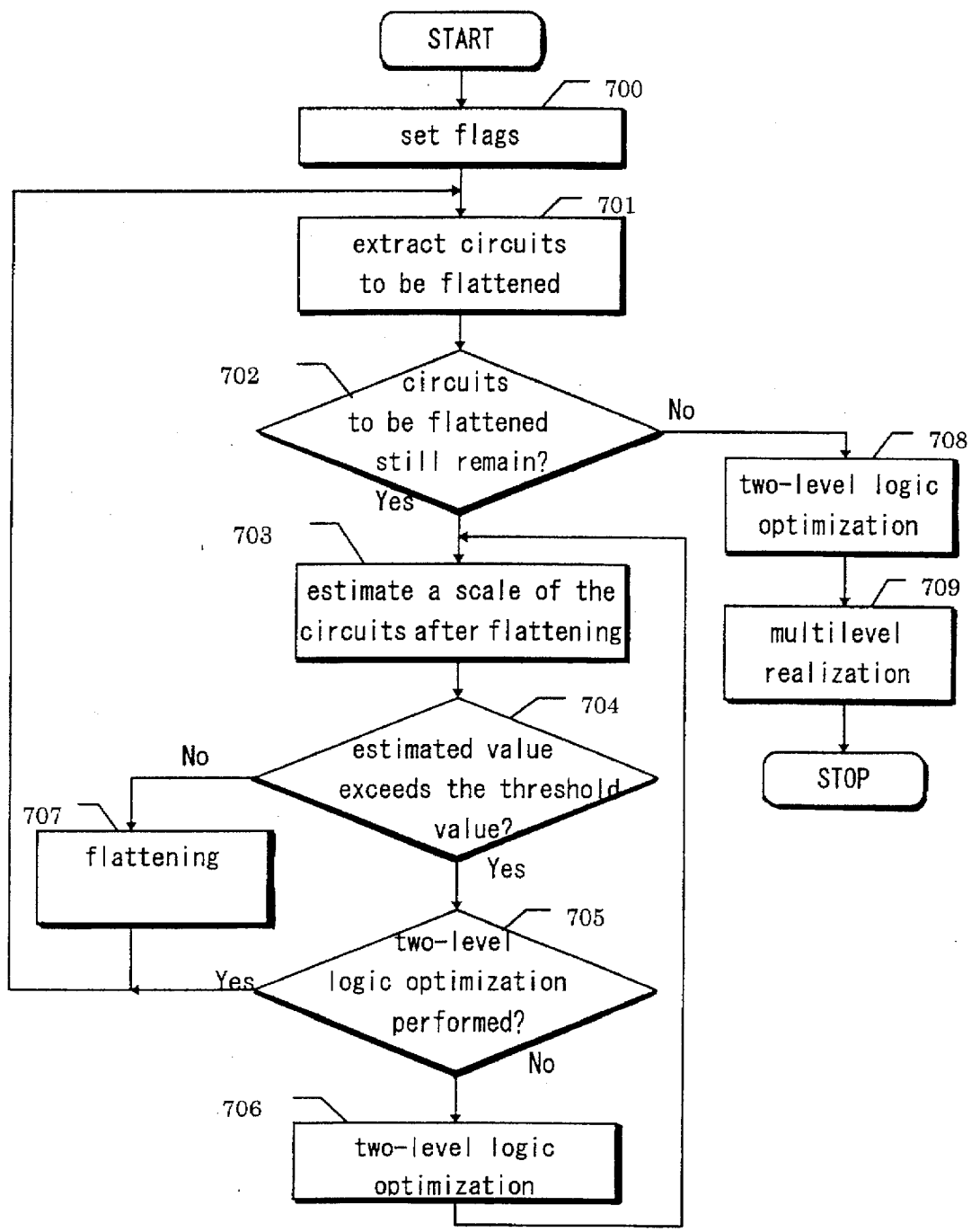
FIG. 7 is a flow chart of processes for logic optimization in an embodiment according to the present invention.

A logical flattening process in the logic optimization process 606 in FIG. 6 will be described in detail with reference to FIG. 7 which is a flow chart for the logic optimization process 606 in this embodiment, wherein the two-level logic optimization process is a logic optimization process to eliminate any logical redundancies, represented by Quine Mucluskey method. The method of two-level logic optimization has been well-known and substantially identical to that of the above-mentioned two-level logic optimization.

The logic optimization is applied lie combinational circuits of logic circuits stored in the memory section 506, as will be described below.

(1) In step 700, set a flag for each intermediate variable to indicate that two-level logic optimization is not performed.

(2) In step 701, extract circuits to be subjected to a logical flattening, namely a combinational circuit corresponding to an intermediate variable and a combinational circuit placed at fan-out of the former circuit. If the circuit subjected to flattening corresponds to a part of the circuit for logic synthesis, them is extracted a circuit subjected to flattening from the part of the circuit. If it is expected that the flattering is insufficient for the logic optimization on the ground that a circuit corresponding to the intermediate variable has a great number of fan-out, no extraction is executed of the circuit for flattening.

(3) In step 702, decide whether a circuit subjected to be flattened exists. If the circuit exists, enter the following step 703. Otherwise, enter the following step 708.

(4) In step 703, estimate a scale of circuits after the logical flattening process.

(5) In step 704, decide whether the estimated scale of the circuit exceeds a predetermined threshold value.

(6) If the estimated scale of the circuit does not exceed the predetermined threshold value, apply flattening process in step 707 to the objective circuit and set the flag indicating that the two-level logic optimization is not performed for a circuit placed at fan-out of the object circuit. Then, return to step 701.

(7) If the estimated scale of the circuit exceeds the predetermined threshold value, examine the flag indicating that two-level logic optimization is not performed. If the flag indicates that tho two-level logic optimization is performed, reenter step 701.

(8) If the flag indicates that the two-level logic optimization is not performed, apply two-level logic optimization to the circuit subjected to be flattened and clear the flag. Then, reenter into step 703. In step 703, a scale of the circuit is estimated with respect to the circuit applied by two-level logic optimization.

(9) In step 708, apply two-level logic optimization to a variable for which the flag indicates that two-level logic optimization is not performed.

(10) In step 709, apply multilevel logic realization to the above optimized circuit, if necessary.

The logical flattening process according to this embodiment is applicable to logic expressions in FIG. 8 as described below. In this case, the number of product terms of the combinational circuit is used as a scale of the circuit.

In step 700, a flag is set for each intermediate variable to indicate that two-level logic optimization is not performed.

Figure 1:
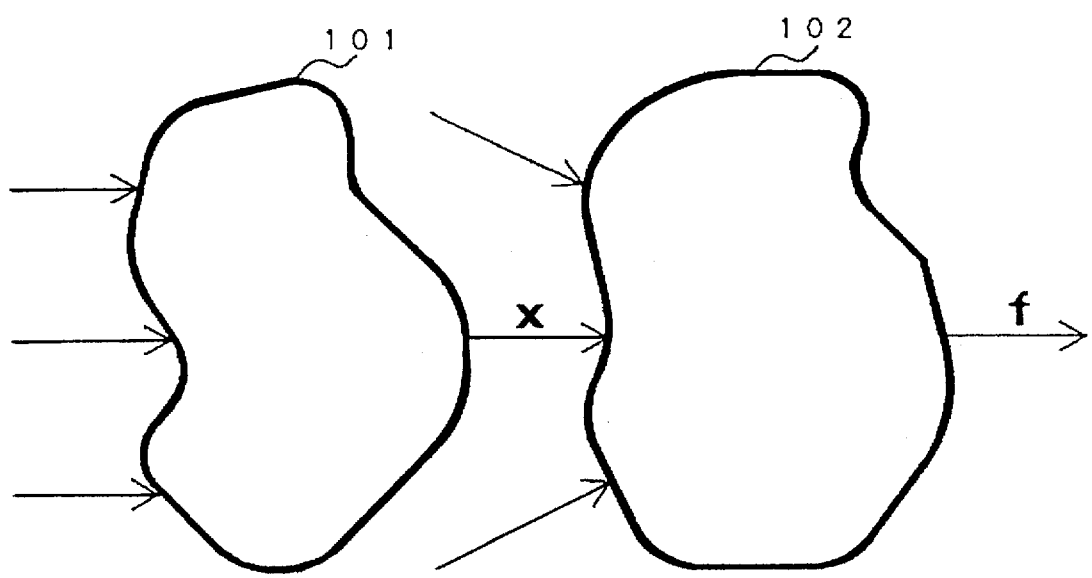
FIG. 1 is a view illustrative of combinational circuits to be flattened.
Figure 2:
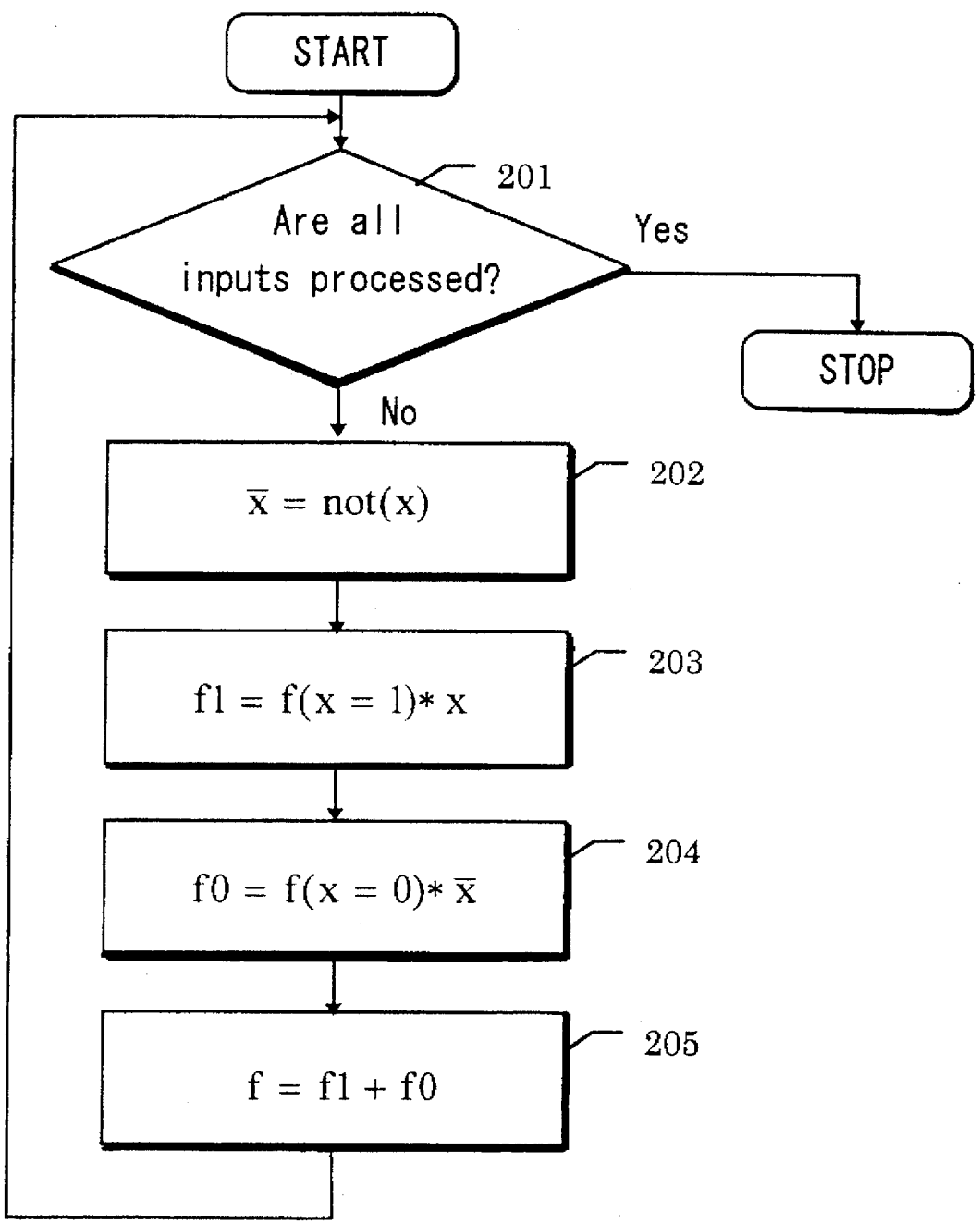
FIG. 2 is a flow chart of a logical flattening process.
Figure 3:
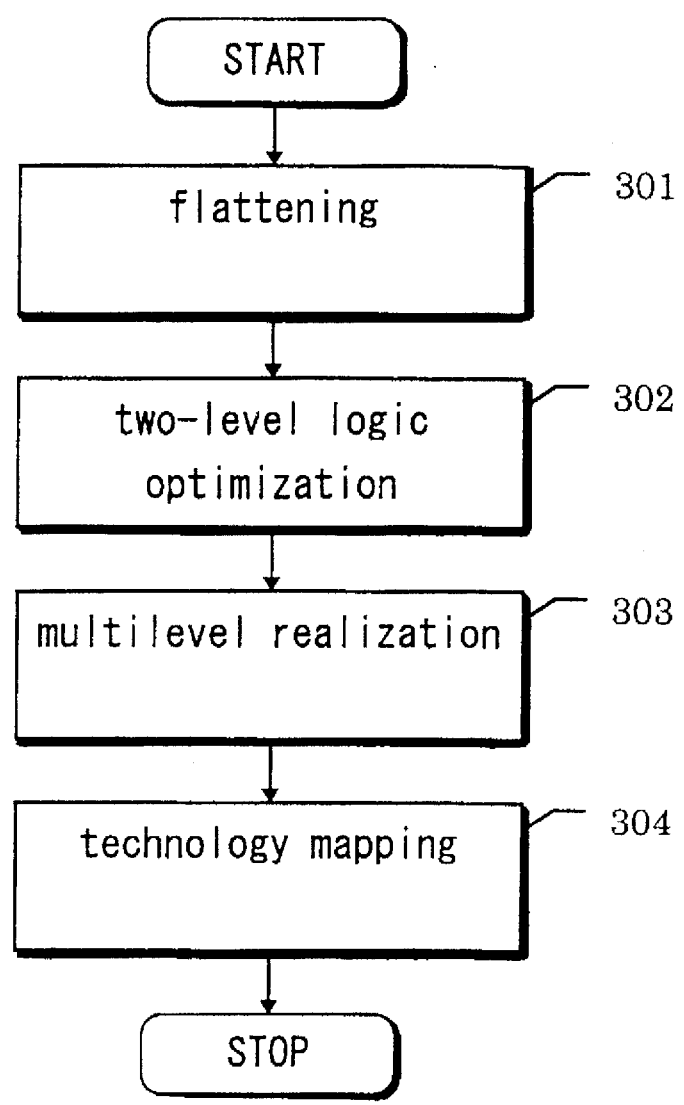
FIG. 3 is a flow chart of an area optimization process.
Figure 4:
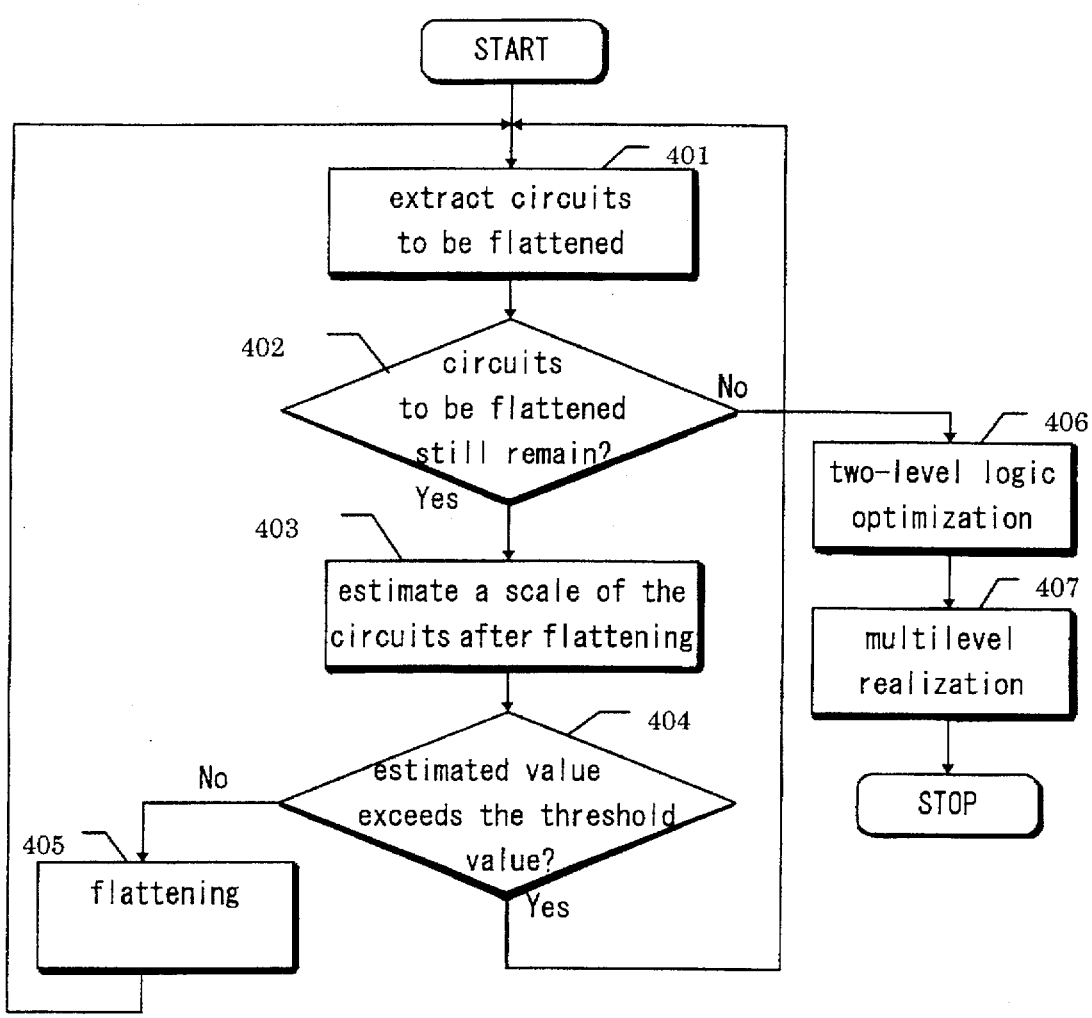
FIG. 4 is a flow chart of a conventional process for logical flattening.

In step 701, assume that an intermediate variable x (801) in a combinational circuit and a circuit f placed at fan-out of the combinational circuit are extracted for logical flattening, wherein i1, i2, i3, i4 and i5 can be the intermediate variables in the combinational circuit as well as external input terminals of the logic circuit and output terminals of circuit elements except combinational logic elements like a flip flop. In FIG. 4, each operator symbol "*", "+" and "–" represents logical multiplication, logical addition and logical NOT operation (reverse), respectively.

In step 702, the variable x and the circuit f are recognized as the objects be flattened, then take step 703.

In step 703, a scale of the circuit which would be obtained by applying the logical flattening process is estimated to compare with a predetermined threshold value. As mentioned above, a number of product terms is used as a scale of the circuit. The number of product terms of the combinational circuit is obtained in accordance with Expression (6).

The number of product terms=(the number of product terms consisting of x in f)*(the number of product terms of x)+(the number of product terms consisting of $\bar{x}$ in f)*(the number of product terms of $\bar{x}$)+(the number of product terms excluding x and $\bar{x}$ in f)  (6)

There can calculate the number of product terms numerically as following.

2*2+2*2+1=9

The number of product terms followed by the logical flattening process was estimated to be 9.

If the number of product terms "9" does not exceed the predetermined threshold value in step 704, enter step 707. Otherwise, enter step 705.

When the flags for f and x indicates that the two-level logic optimization is performed, it is determined that the two-level logic optimization is performed for both f and x. Then, reenter step 701 and attempt to extract another circuit to be flattened.

If either circuit f or x to be flattened has the flag indicating that the top-level logic optimization is not performed, then enter step 706. In step 706, the two-level logic optimization is applied to the objective circuit for x, which has the flag indicating that the two-level logic optimization is not performed. This results in Expressions 803 and 804 in FIG. 8. Then, the flags f and x are set off, returns to step 703.

In step 703, the number of product terms of the circuit after the logical flattening process is estimated. In accordance with Expression (6), the number may be calculated as follows:

$$1*1+1*1+1=3$$

The number is estimated to be 3.

If the product term number "3" does not exceed a predetermined threshold value, enter step 707. If the product term number "3" exceeds a predetermined threshold value, enter step 705. Since the two-level optimization has been executed for f and x, return to step 701.

In step 707, the logic flattening process is executed to set a flag indicating that the two-level logic optimization has not been executed for f. With respect to x, there is no logical change through the logical flattening process, for whic reason there is made no change in flag indicating that the two-level optimization has not yet been executed. The logical flattening provides a logic 805.

As a modification of this embodiment, combinational circuits are expressed in logical expressions. Instead of such logical expressions, truth table, binary decision diagram (BDD) and others may be used.

The method according to this embodiment and conventional one were applied to a circuit having 1736 product terms before the logical optimizations. The conventional method required a memory size of 6552 kilo-bytes as a process size and a CPU time of 78.6 second. By contrast, the novel method according to this embodiment required a reduced memory size of 6424 kilo-bytes with approximately 2 percent reduction as compared to that of the conventional one and a reduced CPU time of 16.6 seconds with approximately 80 percent reduction as compared to that of the conventional one.

A second embodiment according to the present invention will be described below. In this embodiment, instead of the number of the product terms, the estimated number of fan-in after the logical flattening process is used as a scale of the circuits. The fan-in may be calculated in accordance with the following Expression (7).

$$\text{fan-in}=(\text{fan-in for f})+(\text{fan-in for x})-(\text{the number of a common input for f and x})-1 \quad (7)$$

In FIG. 8, the fan-in for f is 4 and the fan-in for x is 2. Thus, a common fan-in for f and x is zero. According to the above Expression (7), 2+4−0−1=5. The estimated number of fan-in after the logical flattening is 5.

The novel method for the logic optimization in this embodiment are the same as the first embodiment except that the fan-in is used to evaluate the scale of the circuits in place of the product term member. In FIG. 7, step 703 is a flatening result estimation process wherein the estimated number of fan-in after the logical flattening is computed to be compared with a threshold value of the predetermined number of fan-in in step 704.

As a further modification, to estimate the circuit scale, it may be available to use the number of product terms together with the number of fan-in in the first and second embodiments.

Whereas modifications of the present invention will be apparent to a person having ordinary skill in the art, to which the invention pertains, it is to be understod that embodiments as shown and described by way of illustrations are by no means intended to be considered in a limiting sense. Accordingly, it is to be intended to cover by claims any modifications which fall within the spirit and scope of the present invention.

What is claimed is:

1. An apparatus for a logic synthesis comprising:

a library input section that enters informations of a technology library block for technology mapping;

a circuit input section that enters descriptions of a logic circuit to be subjected to a logic synthesis;

a constraint condition input section that enters constraint conditions including at least any one of delay and area for said logic circuits;

a logic optimization section that performs a two-level logic optimization during a flattening process;

a technology mapping section that assigns said technology library block to logic circuits in consideration of the given constraint conditions as objective functions; and a circuit output section that output as circuits results of processes in said fifth step.

2. The apparatus as claimed in claim 1, further comprising a memory section that stores any technology libraries, said logic circuits and said constraint conditions.

3. The apparatus as claimed in claim 1, wherein said logic optimization section is so arranged as to execute a process comprising the steps of:

estimating, prior to an actual execution of a logic flattening process, a scale of unoptimized circuits assuming that said unoptimized circuits have already been subjected to said logical flattening;

subjecting said unoptimized circuits to a two-level logic optimization only when an estimated scale of said unoptimized circuits exceeds a predetermined threshold value;

estimating, prior to an actual execution of a logic flattening process, a scale of said optimized circuits, assuming that said optimized circuits have already been subjected to said logic flattening; and subjecting said optimized circuits to said logic flattening if an estimated scale of said optimized circuits does not exceed said predetermined threshold value.

4. A method of executing two-level logic optimization of circuits during logic synthesis processes, said method comprising the steps of:

extracting a circuit to be flattened;

verifying whether said there remains any circuit to be flattened;

executing, if there remains no further circuit to be flattened, a two-level logic optimization of said extracted circuit for subsequent multilevel realization;

estimating, if there remains any further circuit to be flattened, a scale of said extracted circuit assuming that said extracted circuit were flattened;

verifying whether said estimated scale of said circuit exceeds a threshold value;

executing, if said estimated scale of said circuit does not exceed said threshold value, a flattening process of said circuit for subsequent returning to said extracting step for extracting another circuit;

verifying, if said estimated scale of said circuit does exceed said threshold value, whether said two-level logic optimization has already been performed;

returning to said extracting step for extracting another circuit, if said two-level logic optimization has already been performed; and executing, if said two-level logic optimization has not yet been performed, a two-level logic optimization for subsequent returning to said fourth step of estimating a scale of said circuit, wherein said steps are free of a step of evaluating of said circuit.

5. The method as claimed in claim 4, wherein at least one of a number of product terms and of a number of fan-in is used as a scale of the circuits.

6. The method as claimed in claim 4, wherein an intermediate variable is provided with a flag indicating whether said two-level logic optimization has already been executed and wherein said flag indicating that said two-level logic optimization has already been executed is reset at an initialization to indicate that said two-level logic optimization has not yet been executed.

* * * * *